United States Patent [19]
Harada

[11] Patent Number: 5,898,195
[45] Date of Patent: Apr. 27, 1999

[54] SOLID-STATE IMAGING DEVICE OF A VERTICAL OVERFLOW DRAIN SYSTEM

[75] Inventor: Kouichi Harada, Kanagawa, Japan

[73] Assignee: Sony Corporation, Tokyo, Japan

[21] Appl. No.: 08/873,108

[22] Filed: Jun. 11, 1997

[30] Foreign Application Priority Data

Jun. 13, 1996 [JP] Japan ..................................... 8-152494

[51] Int. Cl.$^6$ ................................................ H01L 27/148
[52] U.S. Cl. .......................... 257/223; 257/229; 257/230; 257/445; 257/461
[58] Field of Search .................................... 257/222, 223, 257/229, 232, 233, 230, 445, 461

[56] References Cited

U.S. PATENT DOCUMENTS 5,404,039  4/1995  Watanabe ................................ 257/445

*Primary Examiner*—Minh Loan Tran
*Attorney, Agent, or Firm*—Hill & Simpson

[57] ABSTRACT

A solid-state imaging device of a vertical overflow drain system according to the present invention includes a first conductive type semiconductor substrate, a second conductive type semiconductor well region formed on the first conductive type semiconductor substrate, and a first conductive type, second conductive type or intrinsic high-resistance semiconductor region formed on the second conductive semiconductor well region and having a lower concentration as compared with the second conductive semiconductor well region and a width enough for infrared ray to be sufficiently absorbed. A light receiving portion is formed on a surface of the first conductive type, second conductive type or intrinsic high-resistance semiconductor region.

4 Claims, 6 Drawing Sheets

SOLID-STATE IMAGING DEVICE OF A VERTICAL OVERFLOW DRAIN SYSTEM

BACKGROUND OF THE INVENTION

1. Field of the Invention

The present invention relates to a solid-state imaging device applied to, for example, a charge coupled device (CCD) sensor.

2. Description of the Related Art

Of solid-state imaging devices, a solid-state imaging device of a so-called vertical overflow drain system for draining an excessive charge at a light receiving portion toward a substrate is well known.

In the vertical overflow drain system solid-state imaging device, e.g., in a charge coupled device (CCD) type solid-state imaging device manufactured by employing an n-type semiconductor substrate as a substrate, a method of forming an overflow barrier region by high-energy ion implantation is employed in order to form a so-called overflow barrier deep inside a silicone substrate to thereby improve the sensitivity of the imaging device.

However, when the above method is employed, the overflow barrier can be formed in the silicone without its depth from the surface of the substrate up to about 5 $\mu$m at maximum.

As one of other methods, there is a method of forming an overflow barrier region by heating a portion where ion is implanted and diffusing impurities therein. When this method is employed, it takes a long period of time to manufacture the solid-state imaging device and contamination in the diffusion or the like largely influences the solid-state imaging device, which deteriorates characteristics of the solid-state imaging device.

It is known that the solid-state imaging device manufactured by employing the p-type semiconductor substrate as a substrate has a sensitivity to a frequency region of near infrared rays.

However, since a photoelectric conversion region of a light receiving portion thereof is not all depleted, a modulation transfer function (MTF; which represents a resolution) in the near-infrared-ray region is not satisfactory and a large amount of smear and dark current and so on occur, there is then the problem that the characteristics of the above solid-state imaging device are inferior to those of a solid-state imaging device formed by employing an n-type semiconductor substrate as a substrate.

SUMMARY OF THE INVENTION

In view of such aspects, it is an object of the present invention to provide a solid-state imaging device which has an overflow barrier formed deeply and has satisfactory characteristics.

According to an aspect of the present invention, a solid-state imaging device of a vertical overflow drain system includes a first conductive type semiconductor substrate, a second conductive type semiconductor well region formed on the first conductive type semiconductor substrate, and a first conductive type, second conductive type or intrinsic high-resistance semiconductor region formed on the second conductive semiconductor well region and having a lower concentration as compared with the second conductive semiconductor well region and a width enough for infrared ray to be sufficiently absorbed. A light receiving portion is formed on a surface of the first conductive type, second conductive type or intrinsic semiconductor region.

DESCRIPTION OF THE PREFERRED EMBODIMENT

A solid-state imaging device according to an embodiment of the present invention will hereinafter be described with reference to the accompanying drawings.

Figure 1:
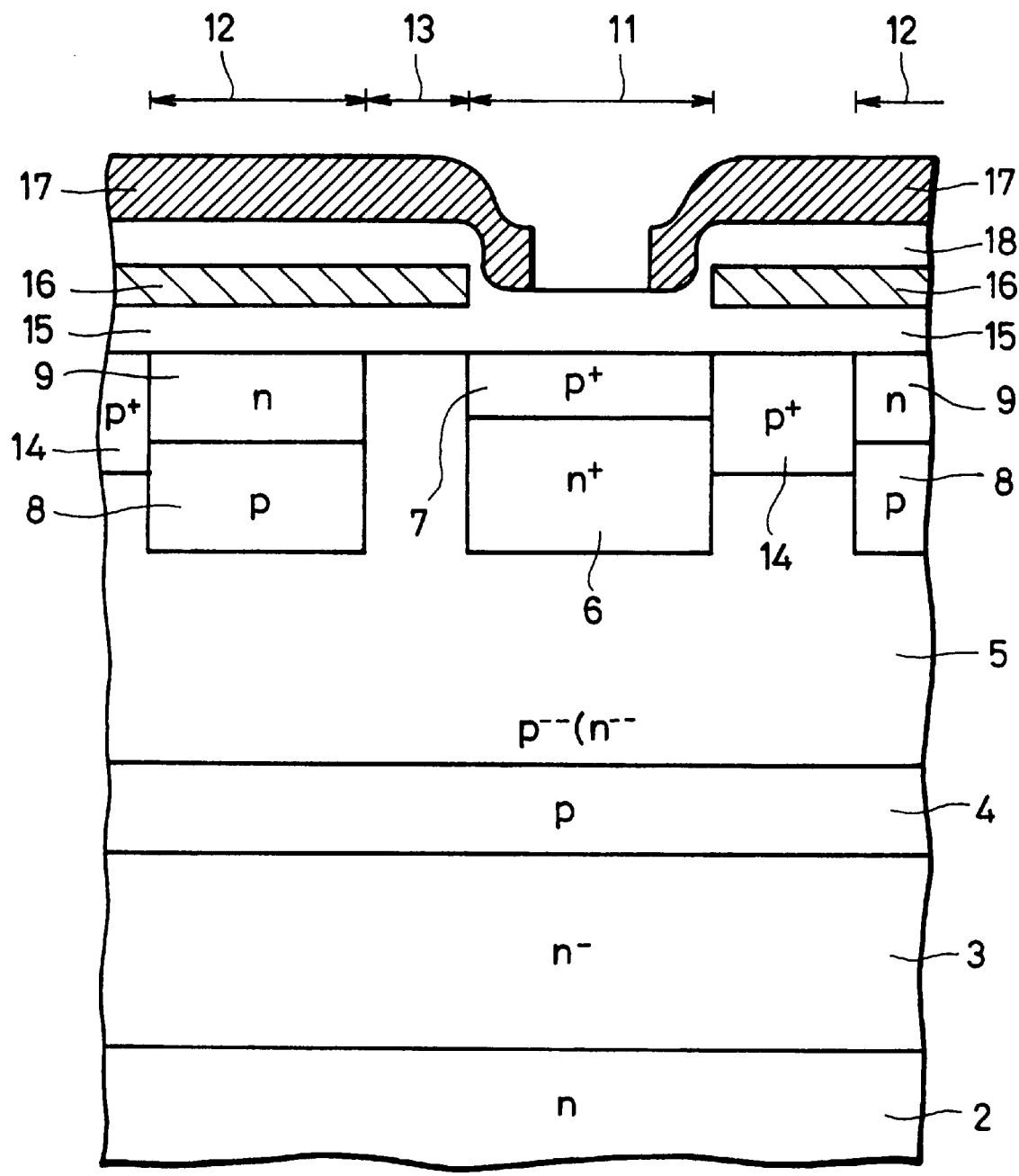
FIG. 1 is a diagram showing an arrangement of a CCD solid-state imaging device of a vertical overflow drain system according to an embodiment of the present invention.

FIG. 1 is a diagram showing an arrangement of a CCD solid-state imaging device of a vertical overflow drain system according to an embodiment of the present invention.

As shown in FIG. 1, a solid-state imaging device 1 has a semiconductor substrate 2 made of a first conductive type, i.e., an n-type silicone in this embodiment. A first-conductive type low-impurity concentration, i.e., n-type epitaxial layer 3 is formed on the semiconductor layer 2. In the epitaxial layer 3, a second-conductive type semiconductor region, i.e., a first p-type semiconductor well region 4 in this embodiment is formed by ion implantation. A high-resistance semiconductor region 5 having a impurity concentration lower than that of the first p-type semiconductor well region 4 is formed on the first p-type semiconductor well region 4 by epitaxial growth. In order to form a light receiving portion 11 on a surface of the high-resistance semiconductor region 5, an $n^+$-type impurity diffusion region 6 is formed and further a $p^+$-type positive charge storage region 7 is formed on the impurity diffusion region 6. In the high-resistance semiconductor region 5 at positions away from the light receiving portion 11, a second p-type semiconductor well region 8 and an n-type transfer channel region 9 are formed and further a p-type channel stopper region 14 is formed.

The first p-type semiconductor well region 4 serves as a so-called overflow barrier region. The light receiving portion 11 serves as a pixel. A plurality of light receiving portions 11 are arranged in a matrix fashion in the real solid-state imaging device.

A reading gate portion 13 is formed between the light receiving portion 11 and a vertical transfer register 12 described later on.

A transfer electrode 16 made of polycrystal silicone, for example, is formed through a gate insulating film 15 on the transfer channel region 9, the channel stopper region 14 and the reading gate portion 13. The transfer channel region 9, the gate insulating film 15 and the transfer electrode 16 form the vertical transfer register 12 having a CCD structure.

Moreover, a light shielding film 17 is formed through an interlayer insulating film 18 covering the transfer electrode 16 on an entire surface except an opening of the light receiving portion 11.

The first-conductive-type low-impurity-concentration epitaxial layer 3 is provided to reduce a so-called shutter voltage. When this epitaxial layer 3 is formed, it is possible to reduce the shutter voltage by using a substrate voltage Vsub.

The second conductive type first semiconductor well region 4 is formed by implanting ion in the fist conductive type low-impurity-concentration epitaxial layer 3 so as to preferably have impurity concentration within the range of $10^{14}$ to $10^{16}$ cm$^{-3}$.

A thickness of the high-resistance semiconductor region 5 is set to 2 μm or larger, preferably to 5 μm or larger. The impurity concentration thereof is set lower than that of the first p-type semiconductor well region 4. The conductive type thereof may be the same p-type as that of the first p-type semiconductor well region 4, an n-type opposite thereto, or a non-doped type (intrinsic).

As described above, there is arranged the so-called vertical overflow drain system CCD solid-state imaging device 1 in which the light receiving portion 11, the first p-type semiconductor well region 4 serving as the overflow barrier, and the substrate 2 serving as an overflow drain are formed in the vertical direction.

Figure 2:
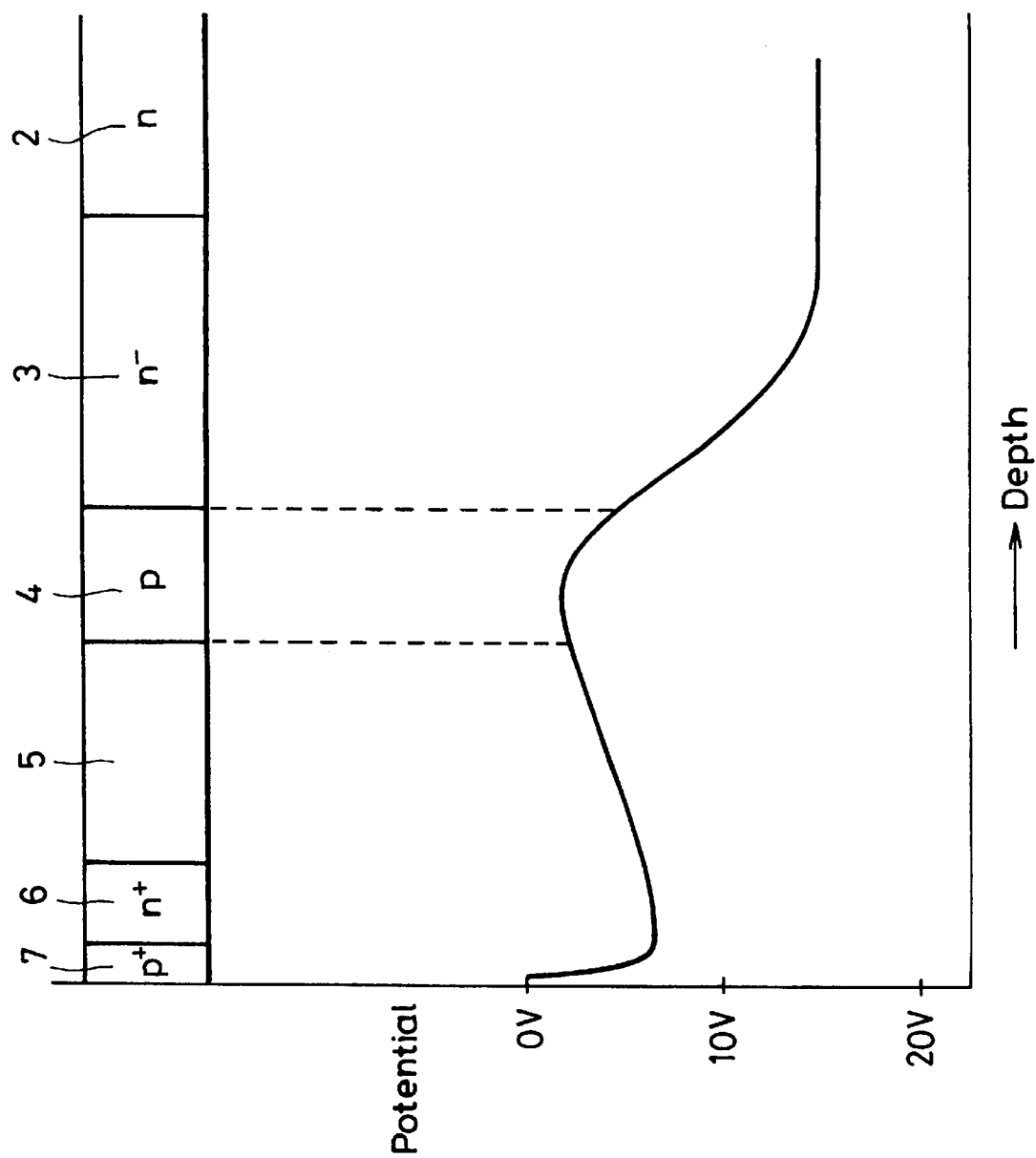
FIG. 2 is a graph showing an impurity profile and a potential of the solid-state imaging device shown in FIG. 1.

FIG. 2 shows an impurity profile of the solid-state imaging device 1 and change of a potential corresponding to the profile.

As shown in FIG. 2, a potential at an top end of the P$^+$-type positive charge storage region 7 is 0V. The potential rises from the middle of the P$^+$-type positive charge storage region 7 and reaches its peak in the vicinity of a pn junction between the n$^+$-type impurity diffusion region 6 and the P$^+$-type positive charge storage region 7. Thereafter, the potential is lowered and becomes minimum in the first p-type semiconductor well region 4. Specifically, the overflow barrier is formed in the first p-type semiconductor well region 4. Then, as the depth is increased, the potential rises higher and then is saturated in the n$^-$-type epitaxial layer 3.

The solid-state imaging device 1 is depleted to a position where the potential becomes saturated.

As described above, according to the solid-state imaging device 1 of this embodiment, since the overflow barrier is formed at the depth at which the infrared rays are sufficiently absorbed, it is possible to easily detect the infrared rays.

A relationship between a wavelength of an incident light on the solid-state imaging device according to this embodiment and a relative sensitivity thereof is checked.

Figure 3A:
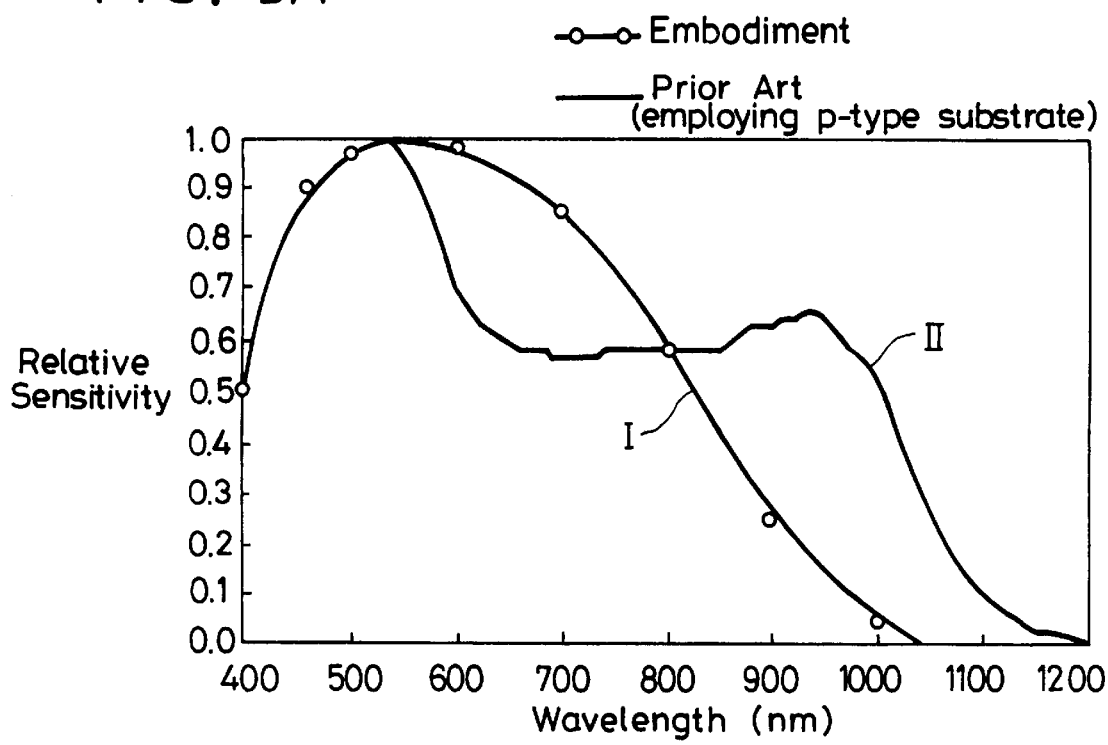
FIGS. 3A and 3B are graphs showing spectral sensitivity characteristics of the solid-state imaging device shown in FIG. 1 in comparison with a conventional CCD solid-state imaging device employing a p-type substrate and a conventional CCD solid-state imaging device employing an n-type substrate, respectively.
Figure 3B:
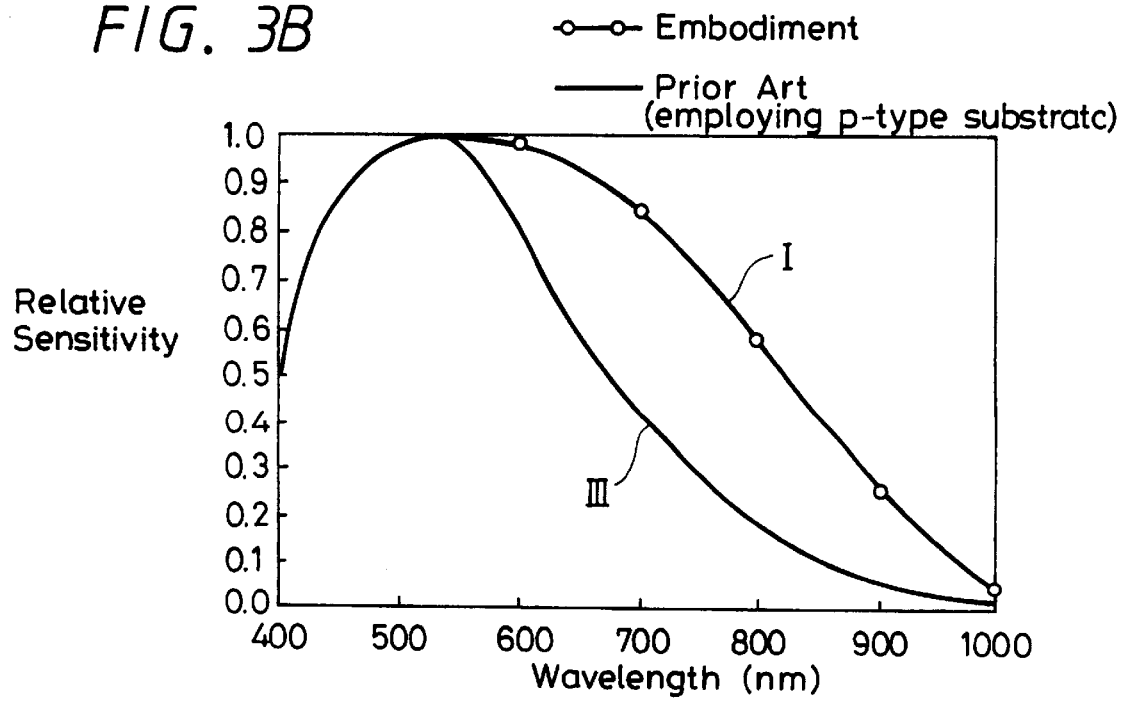

FIGS. 3A and 3B show the relationships therebetween in comparison with the conventional CCD solid-state imaging device employing the p-type substrate and the conventional CCD solid-state imaging device employing the n-type substrate, respectively.

Study of FIG. 3A reveals that the solid-state imaging device 1 according to this embodiment (shown by a curve I in FIG. 3A) has not only high sensitivity to a region of visible light but also sensitivity to a region of infrared ray having a wavelength of 700 nm or larger.

In deed, the conventional solid-state imaging device having the p-type substrate (shown by a curve II in FIG. 3A) also has sensitivity to the infrared ray region, but, as described above, its various characteristics in smear, dark current or the like are inferior to those of the CCD solid-state imaging device employing the n-type substrate.

Comparison with the conventional solid-state imaging device employing the same n-type substrate (shown by a curve III in FIG. 3B) reveals that, as shown in FIG. 3B, the solid-state imaging device 1 according to this embodiment (shown by a curve I in FIG. 3A) is improved in sensitivity to red light which has a long wavelength of visible light and that its sensitivity to the infrared ray region is considerably improved.

As described above, it is understood that use of the solid-state imaging device 1 according to this embodiment practically improves the sensitivity to the infrared ray region.

Specifically, according to this embodiment, it is possible to obtain a solid-state imaging device having sensitivity not only to the visible light but also to the near infrared ray region without giving any influence on other characteristics. In addition, since a width of a depletion layer of the light receiving portion thereof becomes longer as compared with the conventional solid-state imaging device, the sensitivity to the visible light is also improved. The CCD solid-state imaging device employing the n-type substrate according to this embodiment provides characteristics other than the sensitivity similarly to those of the conventional CCD solid-state imaging device employing n-type substrate. Moreover, it becomes possible to carry out an electronic shutter operation for draining charges toward the substrate side.

The solid-state imaging device 1 is manufactured as follow, for example.

Figure 4A:
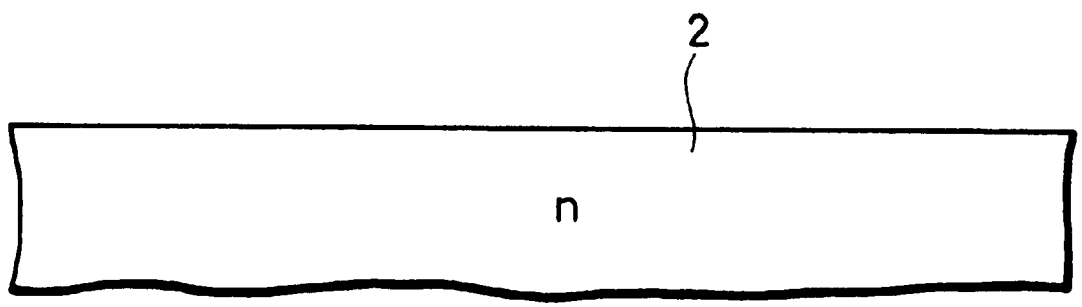
FIGS. 4A and 4B are diagrams used to explain processes of manufacturing the solid-state imaging device shown in FIG. 1.

As shown in FIG. 4A, the first conductive type, e.g., n-type semiconductor substrate 2 is prepared.

Figure 4B:
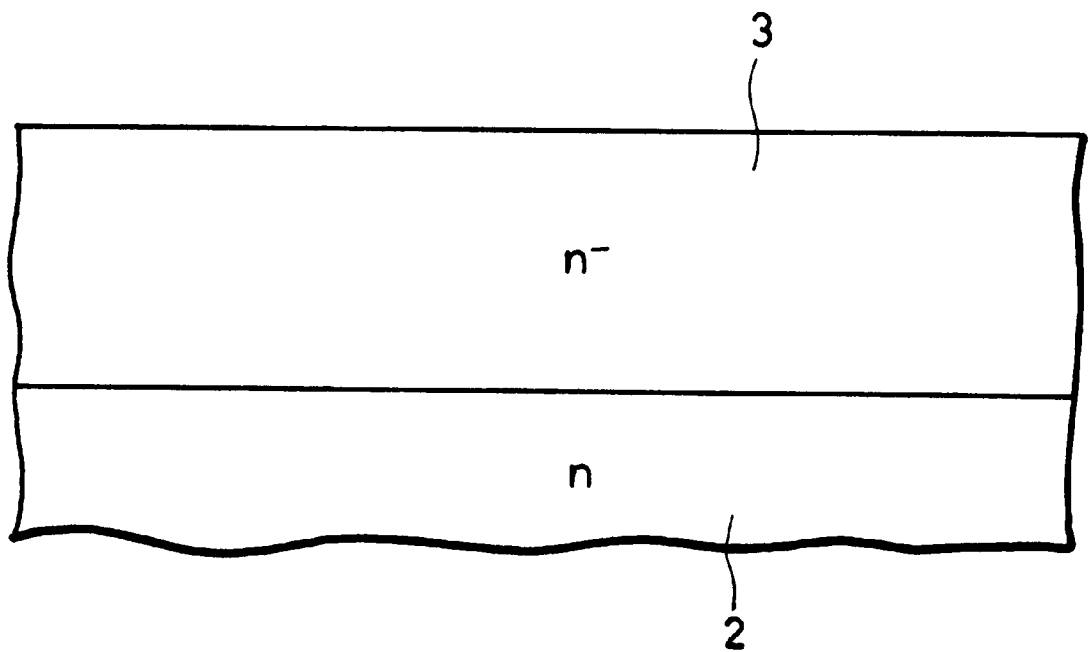
Figure 4C:
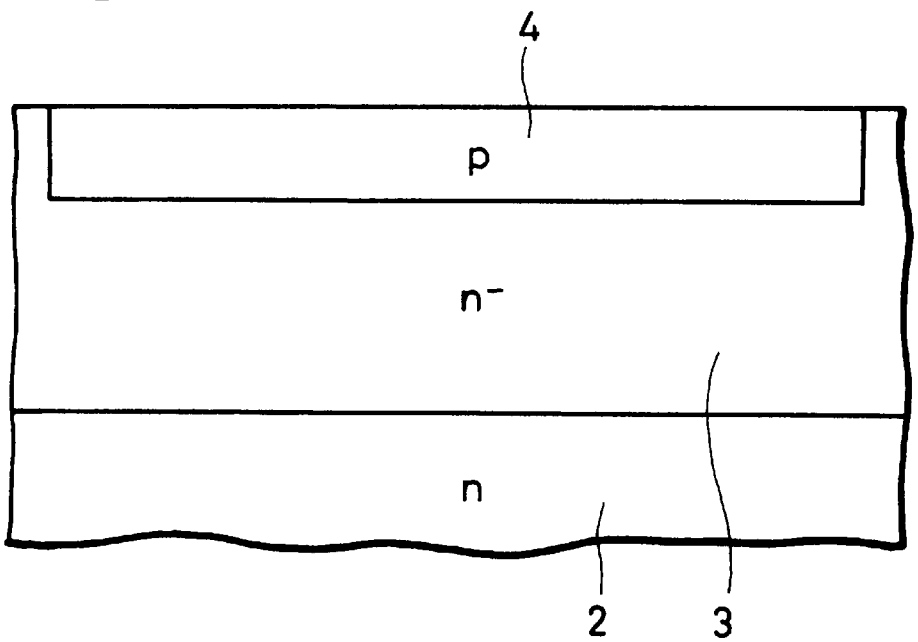
FIGS. 4C and 4D are diagrams used to explain processes of manufacturing the solid-state imaging device shown in FIG. 1.
Figure 4D:
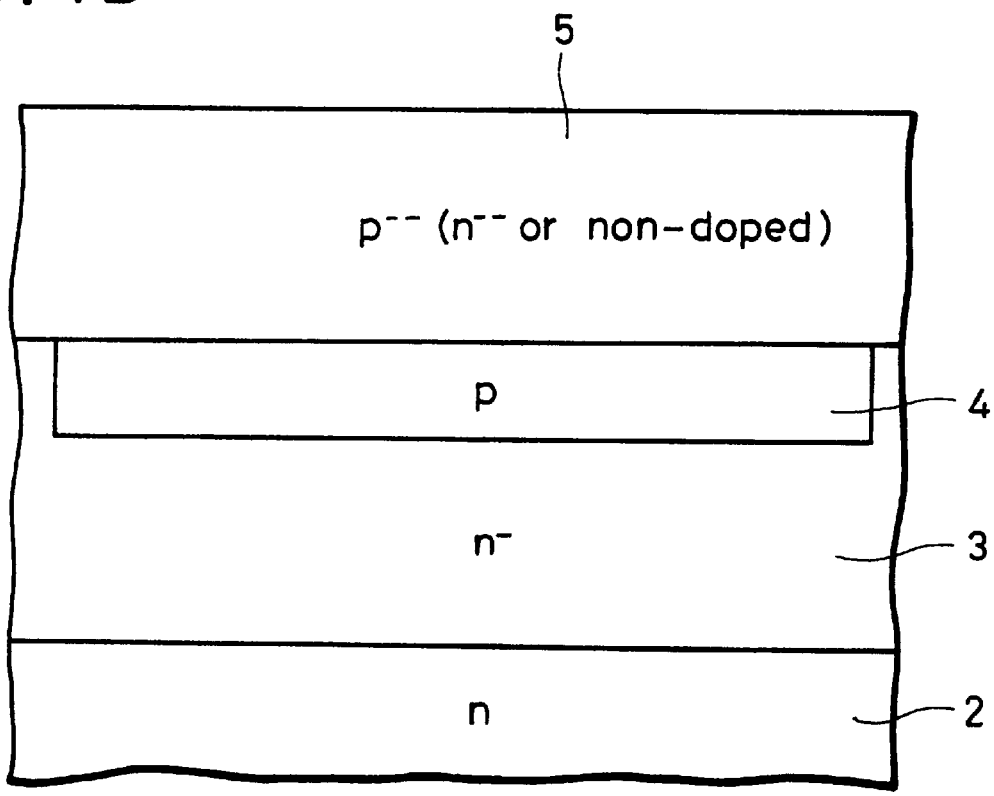
Figure 4E:
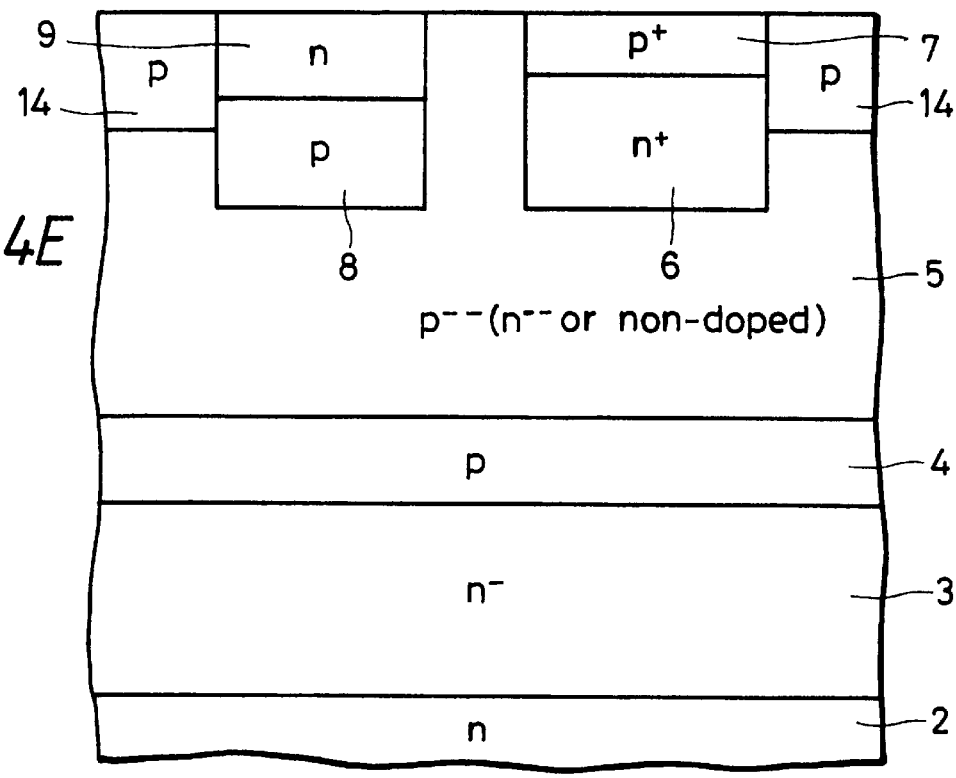
FIGS. 4E and 4F are diagrams used to explain processes of manufacturing the solid-state imaging device shown in FIG. 1.
Figure 4F:
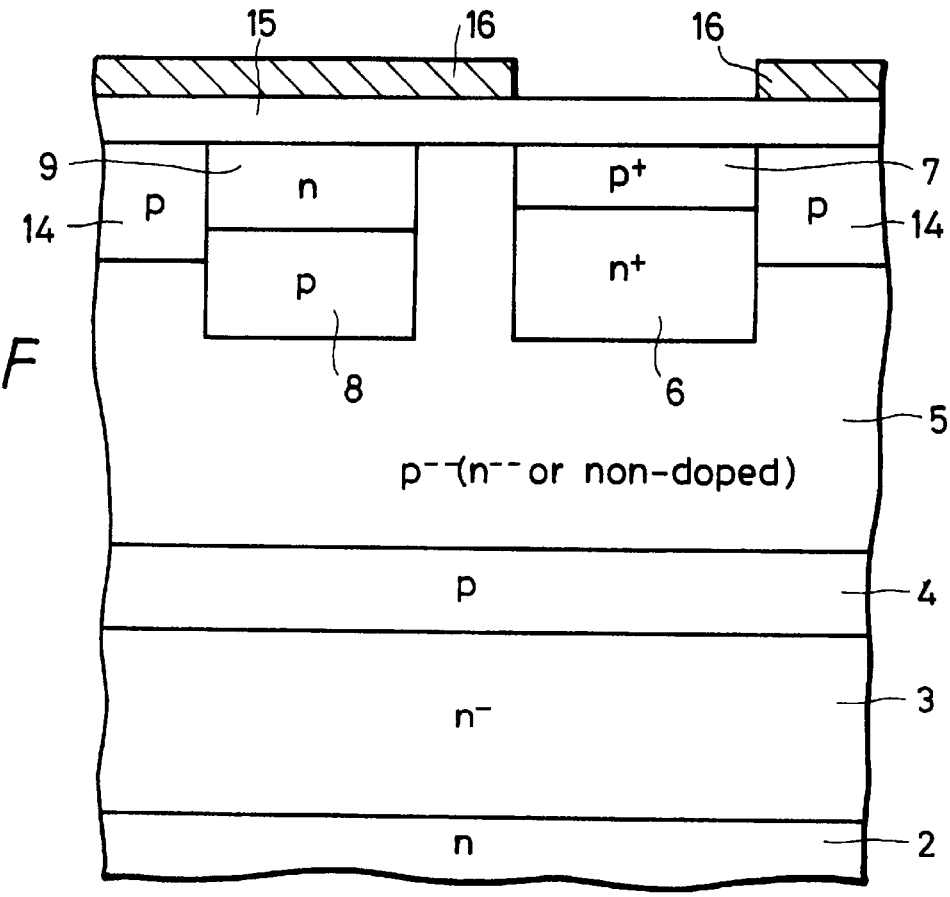

As shown in FIG. 4B, the first conductive type low-impurity-concentration, i.e., n$^-$-type epitaxial layer 3 is formed on the first conductive type semiconductor substrate 2 by epitaxial growth so as to have a thickness of 10 μm, for example.

As shown in FIG. 5C, the second conductive type, i.e., p-type first semiconductor well region 4 is formed in the epitaxial layer 3 by implanting impurity ion to a part of the epitaxial layer 3 with low energy. The first p-type semiconductor well region 4 is formed entirely on a so-called imaging region.

As shown in FIG. 5D, the high-resistance semiconductor region 5 is formed entirely on the epitaxial layer 3 and the first p-type semiconductor well region 4 to cover the same by epitaxial growth so as to have a thickness of 10 μm, for example.

As shown in FIG. 6E (FIGS. 6E and 6F show only a region corresponding one pixel), ion is implanted in the high-resistance semiconductor region 5 to form the n$^+$-type impurity-diffusion region 6, the p$^+$-type positive-charge storage region 7, the second p-type semiconductor well region 8, the n$^+$-type transfer channel region 9 and the p-type channel stopper region 14 which form the light receiving portion 11.

As shown in FIG. 6F, the gate insulating film 15 is formed on an entire surface to cover the same. The transfer electrode 16 made of a polysilicone layer is selectively formed on the gate insulating film 15.

Thereafter, the interlayer insulating film 18 is formed on the transfer electrode 16 so as to cover the transfer electrode 16. The light shielding film 17 formed of light shielding metal such as Al or the like is formed on the interlayer insulating film 18. The light shielding firm 17 has an opening defined at a position corresponding to the light receiving portion 11.

As described above, the solid-state imaging device 1 shown in FIG. 1 can be formed.

While in this embodiment the n⁻-type epitaxial layer 3 is formed on the semiconductor substrate 2, the first p-type semiconductor well region 4 having the opposite conductive type may be formed directly on the n-type semiconductor substrate 2 by ion implantation without the epitaxial layer 3b being formed. In this case, if the high-resistance semiconductor region 5 is formed similarly on the first p-type semiconductor well region 4, then it is possible to deplete the solid-state imaging device 1 deeply.

According to the solid-state imaging device of the present invention, since the second conductive type semiconductor region and the high-resistance semiconductor region having a depth enough for infrared ray to be reached are formed and the light receiving portion is formed on the surface of the high-resistance semiconductor region, the second conductive-type semiconductor region serves as the overflow barrier and can be formed so as to have a depth as that of the overflow barrier enough for the infrared ray to be sufficiently absorbed. Therefore, it is possible to form the solid-state imaging device having the sensitivity to the region of infrared rays.

Since the width of the depletion layer in the light receiving portion can be set longer as compared with the prior art, it is possible to improve the sensitivity to the visible light.

Use of the solid-state imaging device according to the present invention makes it possible to form an electronic shutter which drains charges to the substrate.

When the high-resistance semiconductor region is formed of the epitaxial layer, it is possible to easily form the second conductive type semiconductor region so that its depth should be a depth enough for the infrared ray to be sufficiently absorbed.

When the second conductive semiconductor region is formed by ion implantation, the second conductive type semiconductor region can be formed by ion implantation with lower energy into the first conductive semiconductor substrate.

By setting the concentration of the second conductive type semiconductor region within the range of $10^{14}$ to $10^{16}$ cm$^{-3}$, it is possible to form the sufficient overflow barrier therein.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A solid-state imaging device of a vertical overflow drain system, comprising:

a first conductive type semiconductor substrate;

a second conductive type semiconductor well region formed on said first conductive type semiconductor substrate; and a first conductive type, second conductive type or intrinsic high-resistance semiconductor region formed on said second conductive type semiconductor well region and having a lower concentration as compared with said second conductive type semiconductor well region and further having a sufficient width for infrared rays to be sufficiently absorbed, wherein a light receiving portion is formed on a surface of said first conductive type, second conductive type or intrinsic high-resistance semiconductor region, and wherein said first conductive type, second conductive type or intrinsic high-resistance semiconductor region has a thickness equal to or larger than 2 μm.

2. A solid-state imaging device as claimed in claim 1, wherein said first conductive type, second conductive type or intrinsic high-resistance semiconductor region is further formed of an epitaxial layer.

3. A solid-state imaging device of a vertical overflow drain system, comprising:

a first conductive type semiconductor substrate;

a second conductive type semiconductor well region formed on said first conductive type semiconductor substrate; and a first conductive type, second conductive type or intrinsic high-resistance semiconductor region formed on said second conductive type semiconductor well region and having a lower concentration as compared with said second conductive type semiconductor well region and further having a sufficient width for infrared rays to be sufficiently absorbed, wherein a light receiving portion is formed on a surface of said first conductive type, second conductive type or intrinsic high-resistance semiconductor region, and wherein said first conductive type, second conductive type or intrinsic high-resistance semiconductor region has a thickness equal to or larger than 5 μm.

4. A solid-state imaging device as claimed in claim 3, wherein said first conductive type, second conductive type or intrinsic high-resistance semiconductor region is further formed of an epitaxial layer.

* * * * *